(12) United States Patent
Arai

(10) Patent No.: US 9,784,934 B2
(45) Date of Patent: Oct. 10, 2017

(54) LASER DEVICE

(71) Applicant: Nobuyuki Arai, Kanagawa (JP)

(72) Inventor: Nobuyuki Arai, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/360,403

(22) Filed: Nov. 23, 2016

(65) Prior Publication Data

US 2017/0075085 A1     Mar. 16, 2017

Related U.S. Application Data

(62) Division of application No. 14/741,657, filed on Jun. 17, 2015, now Pat. No. 9,541,721.

(30) Foreign Application Priority Data

Jul. 11, 2014    (JP) ................. 2014-143578

(51) Int. Cl.

| | |
|---|---|
| *G02B 6/42* | (2006.01) |
| *G02B 6/32* | (2006.01) |
| *G02B 3/04* | (2006.01) |
| *H01S 5/42* | (2006.01) |
| *G02B 27/09* | (2006.01) |
| *H01S 5/183* | (2006.01) |
| *G02B 6/26* | (2006.01) |

(Continued)

(52) U.S. Cl.
CPC ......... *G02B 6/4296* (2013.01); *G02B 3/0056* (2013.01); *G02B 3/04* (2013.01); *G02B 6/262* (2013.01); *G02B 6/32* (2013.01); *G02B 27/0905* (2013.01); *G02B 27/0922* (2013.01); *H01S 5/18388* (2013.01); *H01S 5/423* (2013.01); *G02B 3/02* (2013.01); *H01S 5/02284* (2013.01)

(58) Field of Classification Search
CPC ........ G02B 6/4296; G02B 6/262; G02B 3/04; G02B 6/32; G02B 3/0056; H01S 5/18388
See application file for complete search history.

(56) References Cited

U.S. PATENT DOCUMENTS

| | | | | |
|---|---|---|---|---|
| 5,369,661 | A | * | 11/1994 | Yamaguchi .......... G02B 3/0087 372/101 |
| 5,546,487 | A | * | 8/1996 | Fantone .................. G02B 3/04 385/33 |

(Continued)

FOREIGN PATENT DOCUMENTS

| | | |
|---|---|---|
| JP | 10-284779 | 10/1998 |
| JP | 2002-26452 | 1/2002 |

(Continued)

*Primary Examiner* — Ryan Lepisto
(74) *Attorney, Agent, or Firm* — Oblon, McClelland, Maier & Neustadt, L.L.P.

(57) ABSTRACT

A laser device is disclosed. The laser device includes a surface-emitting laser including a plurality of emission points, a lens array including a plurality of lenses arranged so as to correspond to a position of the surface-emitting laser; and a light condensing optical system that condenses a plurality of light fluxes emitted through the lens array and enters the condensed lights to an input end of an optical fiber. The light condensing optical system includes an aspheric lens having positive refractive power. Both of an incidence surface and an emission surface of the aspheric lens have aspheric shapes.

4 Claims, 13 Drawing Sheets

(51) Int. Cl.
*G02B 3/00* (2006.01)
*G02B 3/02* (2006.01)
*H01S 5/022* (2006.01)

(56) References Cited

U.S. PATENT DOCUMENTS

| | | |
|---|---|---|
| 2002/0090172 A1 | 7/2002 | Okazaki et al. |
| 2003/0048819 A1 | 3/2003 | Nagano et al. |
| 2008/0204842 A1 | 8/2008 | Arai et al. |
| 2008/0267662 A1 | 10/2008 | Arai et al. |
| 2013/0255613 A1 | 10/2013 | Hartke et al. |

FOREIGN PATENT DOCUMENTS

| | | |
|---|---|---|
| JP | 2002-202442 | 7/2002 |
| JP | 2003-158332 | 5/2003 |
| JP | 2013-545280 | 12/2013 |

* cited by examiner

LASER DEVICE

CROSS-REFERENCE TO RELATED APPLICATION

The present application is a division of U.S. application Ser. No. 14/741,657 filed Jun. 17, 2015, which is based on and claims priority to Japanese Patent Application No. 2014-143578 filed Jul. 11, 2014, the disclosures of each of which are hereby incorporated by reference herein in their entirety.

BACKGROUND

Technical Field

The present invention relates to a laser device, particularly relates to the laser device including a light condensing optical system which receives a plurality of light fluxes emitted from a plurality of surface-emitting lasers through a lens array and condenses the light on an optical fiber.

Description of Related Art

Recently, a device using a high output laser is widely known in laser beam machining and laser plug art. In addition, it is well known to use not a single but a plurality of synthesized laser beam for obtaining a high-output laser light source.

For example, Patent Document 1, JP2002-202442A, discloses a multiplexing laser light source which includes a plurality of semiconductor lasers, a multi-mode optical fiber, and a light condensing optical system that condenses laser beam emitted from the plurality of semiconductor laser and coupling the condensed laser beams to the multi-mode optical fiber. The plurality of semiconductor lasers are disposed so that their light-emitting points are arranged in a row in a first direction parallel to their active layers; and said light-collecting optics system comprises a plurality of collimator lenses, each having a first aperture diameter in said first direction and a second aperture diameter larger than said first aperture diameter in a second direction perpendicular to said first direction, and provided so that they correspond to each of said plurality of said semiconductor lasers, and a collective lens for collecting said plurality of laser beams collimated by said plurality of collimator lenses and then converging the collimated laser beams on an end face of said multi-mode optical fiber.

Patent Document 2, JP2003-158332A discloses a laser diode array which includes a plurality of multi cavity laser diode tips disposed and fixed in a line to have a plurality of emission points, wherein the multi cavity laser diode tips is arranged and fixed in a row in a same direction with an array direction of an emission point of each multi cavity laser diode tips.

In addition, Patent Document 3, JP10-284779A discloses a light condenser apparatus which includes:

a light source that emits a parallel light flux having a rectangle sectional surface;

a first reflecting unit that is arranged on an optical path of the parallel light flux to reflect a part of the parallel light flux in a first predetermined angle;

a second reflecting unit that is arranged on an optical path of the light flux reflected by the first reflecting unit to reflect the light flux reflected by the first reflecting unit;

a third reflecting unit that is arranged on the optical path of the parallel light flux to reflect a part of the light flux that is not reflected by the first reflecting unit in a second predetermined angle;

a fourth reflecting unit that is arranged on an optical path of the light flux reflected by the third reflecting unit to reflect the light flux reflected by the third reflecting unit; and a light condenser unit that condenses the light flux reflected by the second and fourth reflecting units and the light flux that is not reflected by the first and third reflecting units all at once, wherein the second and fourth reflecting units is configured to reflect each light flux reflected by the first and third reflecting units in a parallel direction to and adjacently to the light flux that is not reflected by the first and third reflecting units.

Recently, such a device disclosed in Patent Document 4, JP2002-026452A, is well known as a high-output laser device including a surface-emitting laser array of a laser light source.

Since a surface-emitting semiconductor laser light source (to be specific, Vertical-cavity surface-emitting laser (VCSEL)) can concentrate its emission points, compared with that in an Edge-emitting LD, a large amount of light can be obtained by arranging many emission points.

In addition, it is required to collimate the light emitted from each emission point in the VCSEL by a micro lens array because such a light is a diverging light flux.

However, since the emission point in the VCSEL has an area upon surface emission, the light collimated by the micro lens necessarily becomes a slightly divergent light flux.

It is generally known in laser synthesizing to use a condenser lens with incidence on the optical fiber, and it is required to use the micro lens corresponding to each emission point. When the emission points are concentrated to have intervals of about several tens of μm in order to obtain a large amount of light, it is required to arrange each lens to have an extremely strong refractive power to include a lens surface corresponding to each emission point. Herein, the curvature radius of the lens is approximately equal to the emission-point intervals for separating the light flux.

However, when the micro lens having such an extremely strong refractive power is disposed shortly after the emission point, a magnification ratio of an entire optical system becomes high. Thereby, a light condensing diameter is caused to increase.

As a function of the laser device, it is required to condense the high-output laser to the optical fiber having a small core diameter.

When the VCSEL is concentrated by decreasing the emission-point interval, a large amount of light can be obtained. However, neither patent nor non-patent documents can disclose a solution to a problem of increase in the light condensing diameter.

Generally, when using the condenser lens with a short focal length, a spot diameter of a light beam condensed on an incident end surface of the fiber decreases. When using the lens with the short focal length, an incidence angle (angle capable of entering into the optical fiber) increases. However, it is not necessarily appropriate to arrange the focal length as short as possible since an angle of light introduced in the optical fiber (fiber NA) is also given. A light condensing optical system including the VCSEL for condensing light in the angle capable of entering into the fiber NA and for condensing light into the smaller spot diameter is not disclosed in any patent or non-patent document.

SUMMARY

The present invention is made in view of the above-described problems and aims to provide a small and high-output laser device which can use a small fiber core.

In order to achieve the above-described aim, a laser device according to aspects of the present invention includes a surface-emitting laser including a plurality of emission points, a lens array including a plurality of lenses arranged so as to correspond to a position of the surface-emitting laser; and a light condensing optical system that condenses a plurality of light fluxes emitted through the lens array and enters the condensed lights to an input end of an optical fiber. The light condensing optical system includes an aspheric lens having positive refractive power. Both of an incidence surface and an emission surface of the aspheric lens have aspheric shapes.

DETAILED DESCRIPTION

Figure 1:
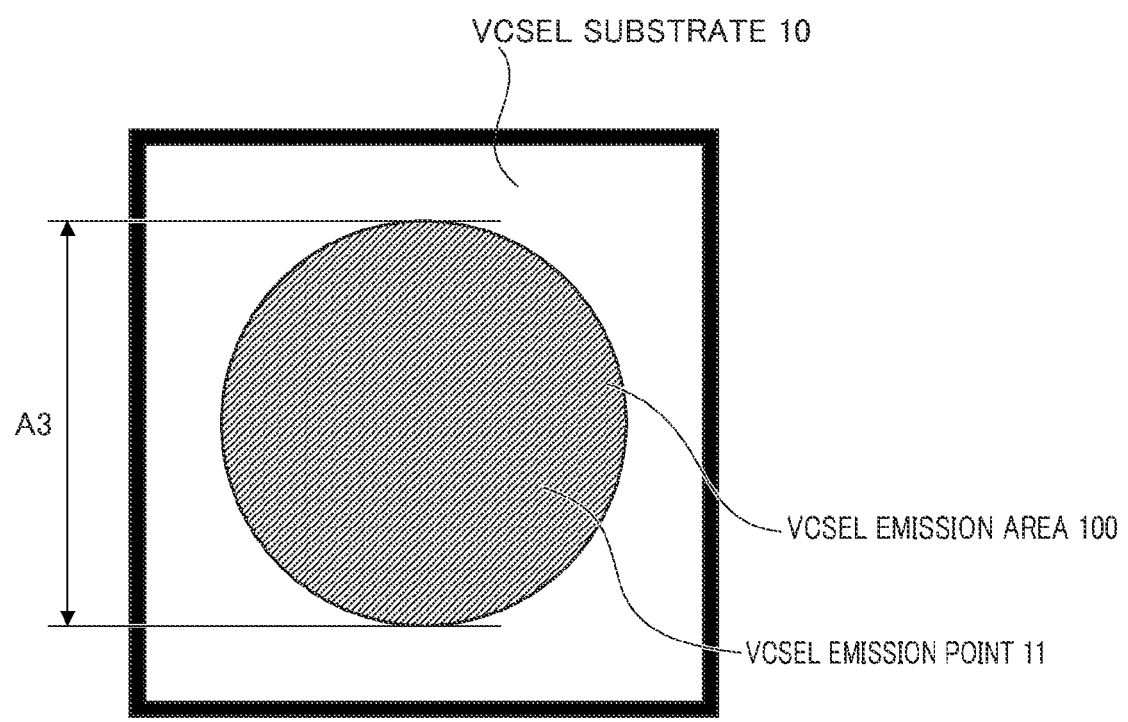
FIG. 1 is a schematic front diagram showing an arrangement of a light source part included in a laser device according to aspects of the present invention.

Hereinafter, according to embodiments and examples of the present invention, a laser device according to aspects of the present invention will be described in detail with reference to figures. Before describing detailed examples, a concept and a principle of the present invention will be described.

The laser device according to aspects of the present invention includes a surface-emitting laser including a plurality of emission points, a lens array including a plurality of lenses arranged so as to correspond to a position of the surface-emitting laser, and a light condensing optical system that condenses a plurality of light fluxes emitted through the lens array and enters the condensed lights to an input end of an optical fiber. The light condensing optical system includes an aspheric lens having positive refractive power. Both of an incidence surface and an emission surface of the aspheric lens have aspheric shapes.

The surface-emitting laser described as above is integrated easily and thus a high power laser may be achieved.

Each light flux emitted from the surface-emitting laser is collimated by the micro lens array arranged to face each emission point, and is condensed on an input end of the optical fiber by the light condensing optical system.

When the light condensing optical system includes the bi-aspheric lens, a curvature radius of the lens on each lens height can be appropriately arranged corresponding to light fluxes emitted from the surface-emitting laser. This is required in decreasing a light condensing diameter.

In addition, the light condensing is performed more efficiently with the minimum configuration by having the single bi-aspheric lens. The light condensing diameter becomes much smaller than the diameter determined according to the magnification when using the bi-aspheric lens.

It is appropriate that each of the incidence surface and the emission surface of the aspheric lens has a rotational symmetry shape, and the rotational symmetry shape is configured such that a curvature of the aspheric lens has an extreme value at a height other than zero.

The refractive power on the optical axis of the lens is positive. The positive refractive power gradually decreases toward the outer side from the optical axis of the lens. The lens may have a negative refractive power in some points.

By arranging the most peripheral side of the lens to have a negative refractive power, the minimum light condensing diameter can be decreased furthermore compared with the light condensing diameter of the condenser lens in which the spherical aberration is corrected.

It is appropriate that at least one of the incident surface and the emission surface of the aspheric lens has an inflection point of a surface shape at a height other than zero.

Since the surface-emitting laser (VCSEL) is the surface light source, the beam emitted from the micro lens necessarily becomes a diverging light flux. In order to condense the diverging light flux on the optical fiber, the positive refractive power is required.

The light condensing optical system according to the present embodiment is configured to decrease the light condensing diameter as small as possible without an intention to form an image.

Therefore, it is required to condense the light beam emitted from each channel of the surface-emitting laser on the same point.

It is required to fit the light condensing point of the light beam around the most peripheral side channel to the light condensing point on a middle portion of the lens.

An incidence angle on the most peripheral side is given by the numerical aperture (NA) of the fiber. According to the incidence angle, strength of the positive power is determined. It is appropriate to apply the strongest power on the peripheral side although the strength of the power depends on the numerical aperture NA.

In the light condensing optical system, the convex shape of the lens on the optical axis is configured to gradually change the shape to be a concave shape toward the outside of the optical axis in order to condense the beam on the optical fiber. The lens has a negative curve around the most peripheral side portion. Thereby, the light condensing diameter can be decreased more compared with the general aspheric lens in which the spherical aberration is corrected.

When a focal length of the lens array is f1, an emission area diameter per 1 channel of the surface-emitting laser is A1, a distance from the lens array to the light condensing optical system is d3, and a lens height of the surface of the light condensing optical system at the inflection point is hi, in one of the incidence surface or the emission surface in the light condensing optical system, it is appropriate that the condenser lens satisfies the following condition (1).

$$h1 > A1/2 \times d3/f1 \quad (1)$$

It is appropriate that the inflection point of the curvature on the surface of the light condensing optical system is arranged on the outer side of the light beam incident position of the channel arranged on the optical axis.

The light beam emitted from the emission point on the lens center is imaged on a predetermined position. It is appropriate to configure the lens to have the shape so that the light on the emission point on the lens center is imaged on a predetermined point, and the light emitted from the peripheral portion of the emission point enters on the optical fiber while having the smallest light condensing diameter on the surface end of the optical fiber.

In order to reduce the light condensing diameter on the fiber, the light condensing diameter can be decreased by applying the negative refractive power to a part of the light beam emitted from the emission point on the peripheral side. The inflection point is arranged on the outer side of the light beam emitted from the emission point in the center for decreasing the light beam condensing diameter.

In addition, in the laser device, it is appropriate that the light condensing optical system includes an aspheric glass lens having the aspheric shape on both surfaces.

The laser device according to the present embodiment is a system which condenses the light on the fiber. The light emitted from the light source has a huge light amount. Accordingly, a heat quantity generated by converting the light absorbed by the lens also become large, thereby the temperature of the entire device becomes high. By providing a glass lens instead of a plastic lens as the condenser lens, it becomes possible to suppress expansion of the lens and deterioration caused by time and/or environment.

Embodiment 1

Next, an arrangement of a laser device according to the embodiment 1 of the present invention will be described with reference to FIG. 1 to FIG. 4.

FIG. 1 is an enlarged front diagram showing an arrangement of a light source part included in the laser device according to the embodiment of the present invention.

Figure 2:
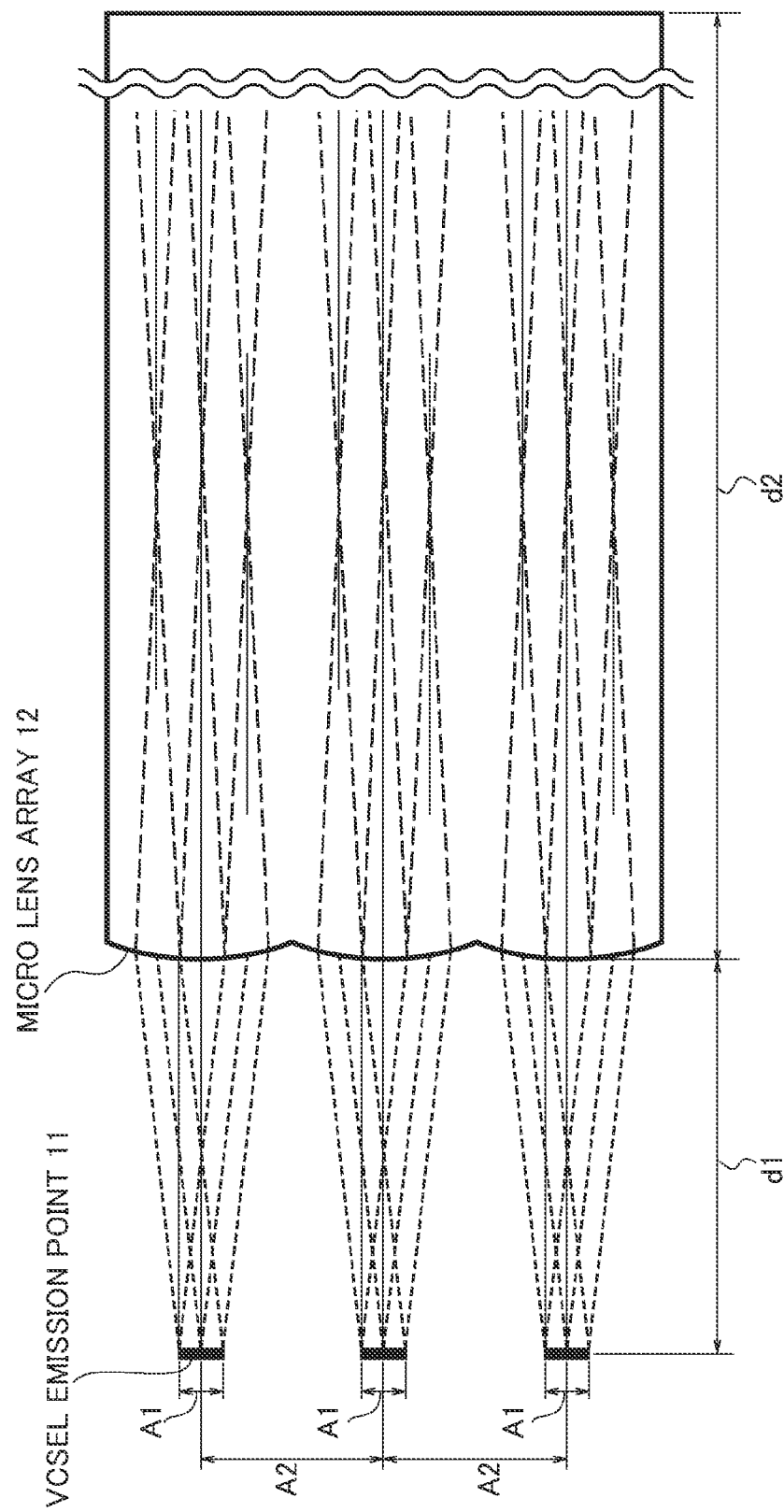
FIG. 2 is an enlarged plan diagram showing a part from a light source to a micro lens array which configures a laser device according to an embodiment 1 of the present invention.

FIG. 2 is an enlarged plan diagram showing a part from a light source to a micro lens array which configures the laser device according to the embodiment 1 of the present invention.

Figure 3:
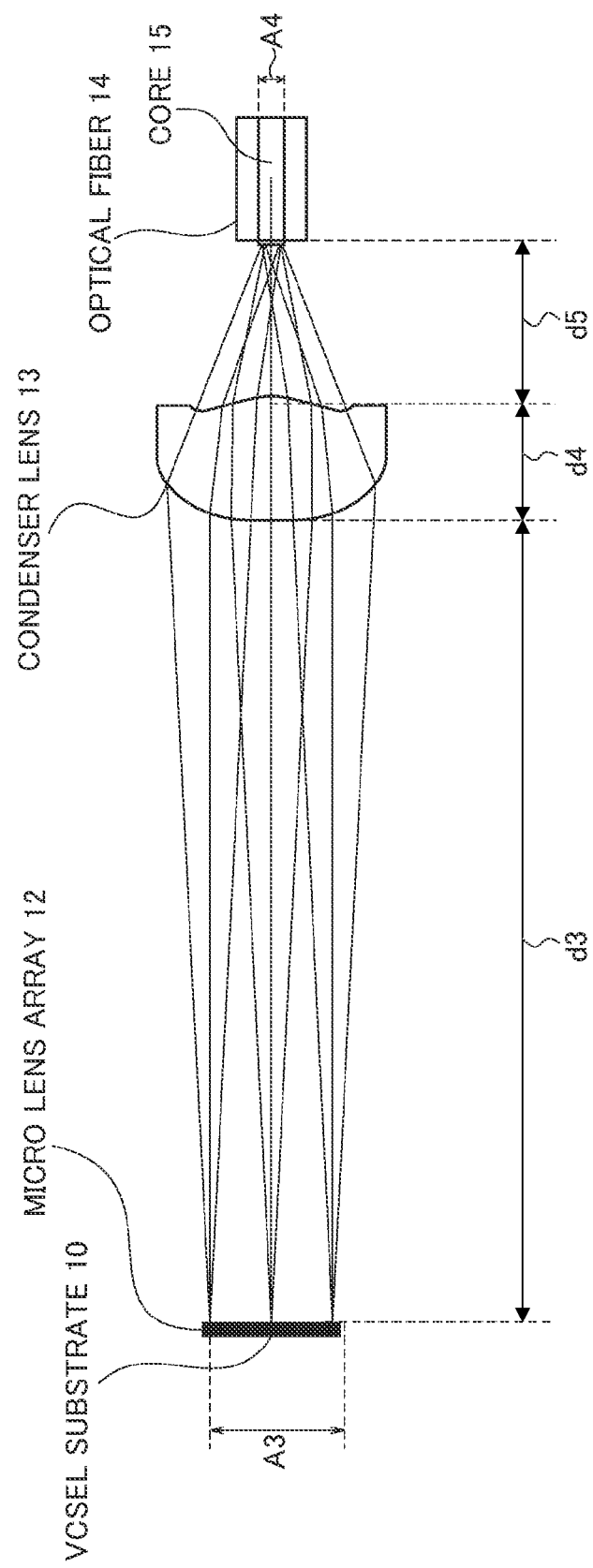
FIG. 3 is a schematic plan diagram showing an arrangement of the laser device according to the embodiment 1 of the present invention.

FIG. 3 is a plan diagram showing an entire arrangement of the laser device according to the embodiment 1 of the present invention.

Figure 4:
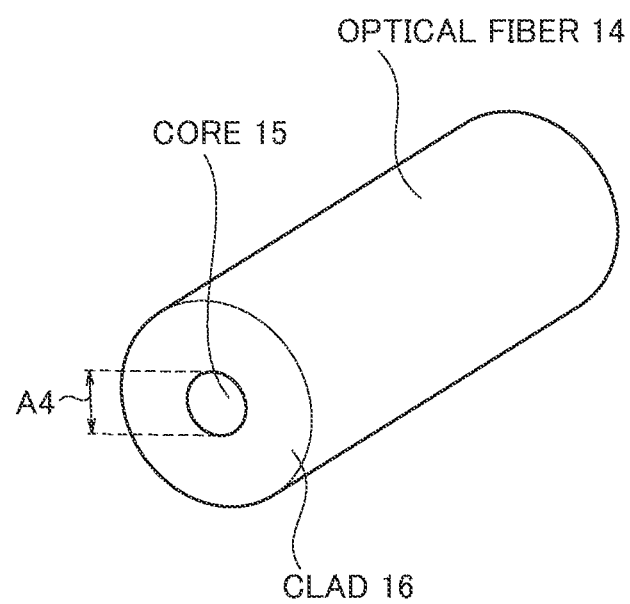
FIG. 4 is a schematic perspective diagram showing an arrangement of an optical fiber included in the laser device according to the embodiments of the present invention.

FIG. 4 is an enlarged perspective diagram schematically showing an arrangement of an optical fiber included in the laser device according to the embodiments of the present invention.

In FIG. 1, a laser device according to the embodiment 1 of the present invention is a surface-emitting laser. The laser is a vertical-cavity surface-emitting laser (hereinafter referred to as VCSEL) arranged on a VCSEL substrate 10. A VCSEL emission area 100 has a circle shape having a diameter of 8.9 mm (A3) in which a plurality of VCSEL emission points 11 are arranged at equal intervals A2 of 48 μm.

Herein, the VCSEL is supplementary described. Generally, an edge emitting laser resonates light in the parallel direction to a substrate surface and emits light in the same direction. In contrast, the VCSEL is a semiconductor laser device which can resonate light in the vertical direction to the substrate surface and emit a light beam in the vertical direction to the substrate surface. The edge emitting semiconductor laser is difficult to be integrated as an array element due to a size increase caused by the one-dimensional arrangement (linear array). Thus, it is difficult to arrange the semiconductor laser to be highly integrated.

On the other hand, the VCSEL can be arranged two-dimensionally. Therefore, the laser beam can be highly concentrated, compared with those in the conventional art.

In the VCSEL included in the laser device according to the embodiment 1, in FIG. 1, as an example, the VCSEL emission area 100 has a circle shape having the diameter A3 of 8.9 mm. In the VCSEL emission area 100, many VCSEL emission points 11 are arranged at equal intervals A2 of 48 μm (refer to FIG. 2). As described above, compared with the edge emitting laser, the VCSEL can be integrated easier. Thus, a high power light amount can be obtained by arranging several emission points.

In FIG. 2, an enlarged diagram of the arrangement from the VCSEL emission point 11 as the light source of the laser device according to the example 1 of the present invention to a micro lens array 12 is illustrated.

The light emitted from the VCSEL emission point 11 is collimated by the micro lens array 12 having a lens surface corresponding to each VCSEL emission point 11.

The micro lens array 12 is made of a synthetic silica lens with a focal length f of 0.11 mm. Each of the VCSEL emission point 11 has an area with a diameter A1 of 10 μm therefore the collimated light beam does not completely become a parallel light flux but becomes a slightly divergent light flux.

In FIG. 2, A1 is a diameter of the VCSEL emission point 11, A2 is an interval of each VCSEL emission point 11, d1 is a distance between the VCSEL emission points 11 and the micro lens array 12, and d2 is a distance between an incidence surface and an emission surface of the micro lens array 12.

In FIG. 3, an arrangement of the laser device according to the embodiment 1 of the present invention is shown. A plurality of light beams are emitted from the circle shape area having the diameter A3 but in order to make the description simpler, light beams emitted from three emission points are illustrated in FIG. 3. One of the three emission points is the center of the VCSEL emission area 100 (refer to FIG. 1) and the other two are at the most peripheral sides of the VCSEL emission area 100.

The slightly divergent light flux collimated by the micro lens array 12 is condensed by a condenser lens 13. The condenser lens 13 is a glass mold aspheric lens and represents a light condensing optical system. The nearly parallel light flux is condensed into a core 15 having a diameter A4 (diameter of 1.44 mm) of an optical fiber 14.

The laser device is required to condense the high power light into the fiber having as small core diameter as possible. Accordingly, the optical system is required to condense the light flux emitted from the light source to be as small as possible.

In FIG. 3, the reference character A3 is a diameter of the VCSEL emission area 100, A4 is the diameter of the core 15 of the optical fiber 14, d3 is a distance between the micro lens array 12 and an incidence surface of the condenser lens 13 on the optical axis, d4 is a thickness of the condenser lens 13 on a center of the optical axis, and d5 is a distance between the emission surface of the condenser lens 13 and the incidence surface of the optical fiber 14 on the optical axis.

An external arrangement of the optical fiber 14 described as above is shown in FIG. 4.

Since the optical fiber 14 transfers the light by total reflection caused by a difference of the refractive index between the core 15 and a clad 16, it is required to enter the light with an incidence angle which permits the total reflection. Since the maximum incidence angle (fiber NA) that the optical fiber can handle is predetermined, the incidence angle of the light beam entering the optical fiber needs to be smaller than the angle predetermined based on the fiber NA.

Example 1

Next, a detailed numerical value example 1 of the embodiment 1 (hereinafter simply referred to as the example 1) will be described as follows.

Reference numerals and characters in the example 1 are as follows:

A1 (μm): diameter of emission area per 1 channel of the VCSEL emission point 11
A2 (μm): interval of the VCSEL emission points 11
A3 (μm): diameter of the VCSEL emission area 100
A4 (μm): diameter of the core 15 of the optical fiber 14
d1 (mm): distance between the VCSEL emission point 11 and the incidence surface of the micro lens array 12
d2 (mm): length of the micro lens array 12
d3 (mm): distance between the micro lens array 12 and the incidence surface of the condenser lens 13 on the optical axis
d4 (mm): thickness of the condenser lens 13 on the center of the optical axis
d5 (mm): distance between the emission surface of the condenser lens 13 and the incidence surface of the optical fiber 14 on the optical axis
f1 (mm): focal length of the micro lens array 12
R (mm): paraxial curvature radius of the condenser lens 13
K (mm): conic constant
Bi: aspheric surface coefficient at each order (i: 1 to 14)
h (mm): lens height from the optical axis The optical system data according to the example 1 is shown in the following table 1.

TABLE 1

| OPTICAL SYSTEM DATA OF EXAMPLE 1 | |
| --- | --- |
| A1 (μm) | 10 |
| A2 (μm) | 48 |
| A3 (mm) | 8.9 |
| A4 (mm) | 1.44 |
| d1 (mm) | 0.0931 |
| d2 (mm) | 1.036 |
| d3 (mm) | 58 |
| d4 (mm) | 9.02 |
| d5 (mm) | 11.08 |
| MAXIMUM INCIDENCE ANGLE (deg) | 22.9 |
| CURVATURE OF CONDENSER LENS | 1.51633 |
| FOCAL LENGTH OF CONDENSER LENS (mm) | 12.14 |
| FOCAL LENGTH OF MICRO LENS ARRAY F1 (mm) | 0.1 |

The optical system data which defines the aspheric shape of the condenser lens 13 according to the example 1 is shown in the following table 2.

TABLE 2

| ASPHERIC SHAPE OF CONDENSER LENS 13 | | |
| --- | --- | --- |
| | INCIDENCE SURFACE | EMISSION SURFACE |
| R | 47.834 | −6.659 |
| K | 0 | |
| B4 | 9.90E−04 | 1.08E−03 |
| B6 | −1.93E−05 | 4.89E−05 |
| B8 | 3.44E−07 | 5.99E−07 |
| B10 | 3.01E−10 | −1.04E−07 |
| B12 | −8.23E−11 | 2.17E−09 |
| B14 | 7.77E−13 | 0 |

An aspheric eccentricity amount $Z(h)$ is defined by the following equation. In the expression (2), R indicates a paraxial curvature radius, h indicates the lens height from the optical axis, K indicates a conic constant, Bi indicates an aspheric surface coefficient at each order, and a summation index i is incremented from 1 to 14. By applying the values of the paraxial curvature radius, the conic constant, and the aspheric surface coefficient into the expression (2), the aspheric eccentricity amount $Z(h)$ is determined.

$$Z(h) = \frac{(1/R) \cdot h^2}{1 + \sqrt{1 - (1+K) \cdot (h/R)^2}} + \sum Bi \cdot hi \qquad (2)$$

Figure 5:
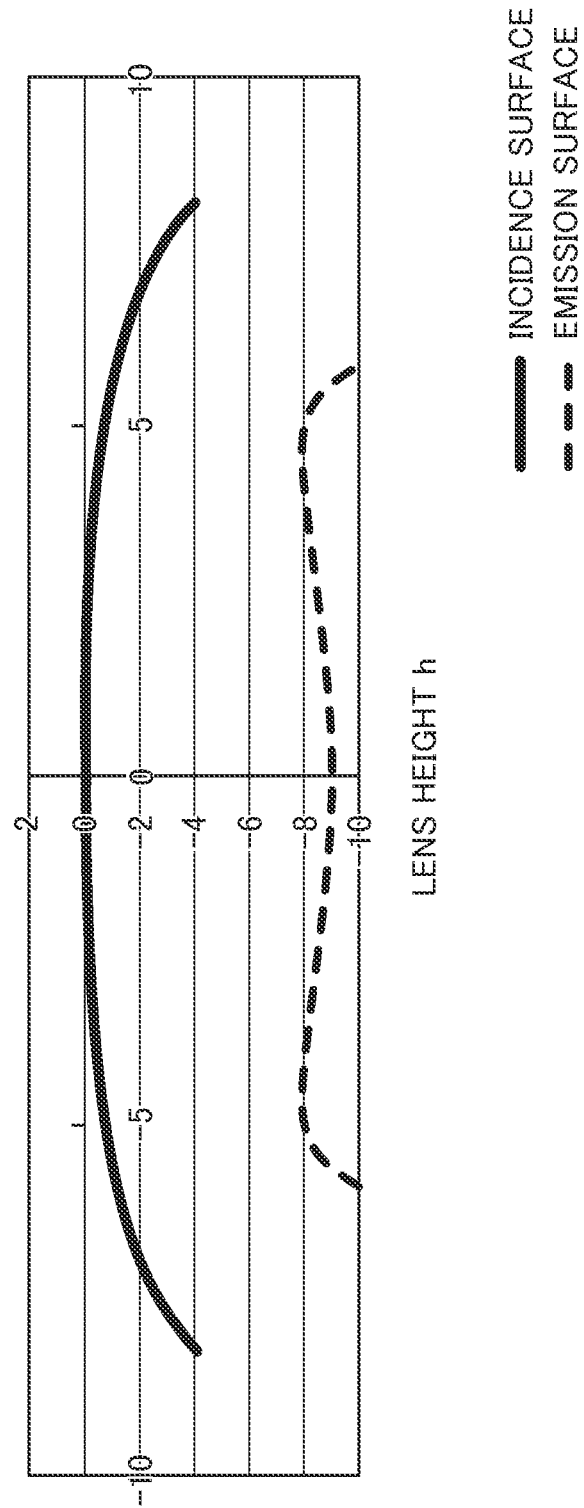
FIG. 5 is a diagram showing a surface shape of a condenser lens included in the laser device according to the embodiment 1 of the present invention by plotting a lens height on a horizontal axis and plotting a depth of lens groove on a vertical axis where a lens center of an incidence surface is an origin.
Figure 6:
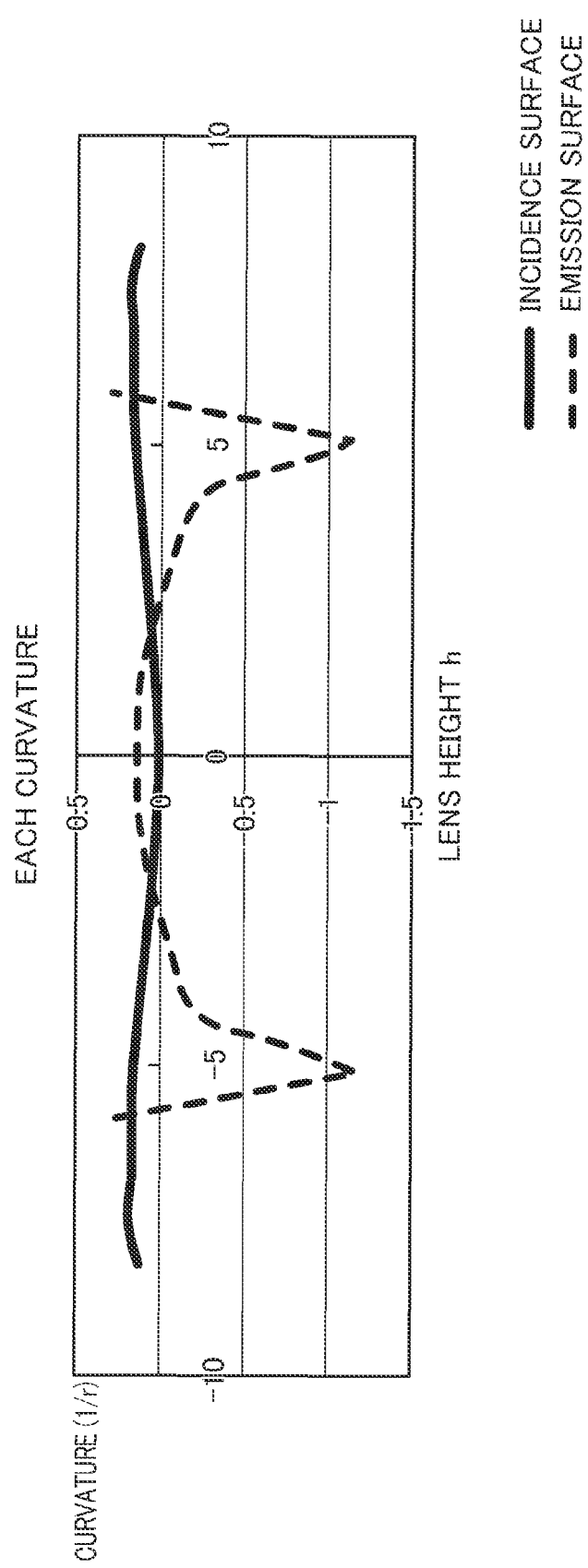
FIG. 6 is a diagram plotting a curvature on each lens height of a condenser lens included in the laser device according to the example 1.

FIG. 5 shows the plotted surface shape of the condenser lens 13 according to the example 1. FIG. 6 shows the chart showing the curvature (reciprocal of curvature radius) of the incidence surface and the emission surface of the condenser lens 13 corresponding to the lens height of the condenser lens 13.

In FIG. 5, the lens height is plotted on the horizontal axis and the depth of lens groove is plotted on the vertical axis where the lens center (lens height h=0) of the incidence surface is the origin. The thickness of the lens is considered in relation to the emission surface.

In FIG. 6, the curvature (reciprocal of curvature radius) of the lens at each lens height is plotted. Since both of the incidence side and emission side surfaces are aspheric surfaces, the curvature can be changed at each lens height. In FIG. 6, the positive values of the curvatures represent positive refractive powers for both of the incidence surface and the emission surface.

The condenser lens 13 has a rotational symmetry form as its characteristic feature. The condenser lens 13 is a positive biconvex lens in which the curvature on the emission surface side is larger than that of the incidence surface side at the lens center of the condenser lens 13. The incidence surface of the condenser lens 13 has the positive refractive power at every lens height by appropriately arranging the curvature thereof. The variation f(h) of the curvature in relation to the lens height shows the inflection point at the height of 7.6.

On the other hand, the emission surface of the condenser lens 13 has a positive refractive power on the lens center but the positive power of the emission surface gradually decreases toward the peripheral sides, and the curvature is changed from the positive refractive power to the negative refractive power at the height of 3.69. The minimum value (extreme value) of the negative curvature is shown at the height of 5.65 and the lens power of the emission surface gradually becomes positive toward the most peripheral side.

The emission surface has the inflection point of the shape at the height of 5.1.

The smallest light condensing diameter A4 of the condenser lens 13 is reduced to 1.44 mm by having the shape of the lens described as above.

It is appropriate that the condenser lens 13 satisfies the following expression (1) where the focal length of the micro lens array 12 is f1, the diameter of emission area per 1 channel of the VCSEL emission area 100 representing the surface-emitting laser is A1, the distance between the micro lens array 12 and the condenser lens 13 is d3, and the lens height of the inflection point on the surface of the condenser lens 13 is h1, in the incidence and emission surfaces of the condenser lens 13.

$$h1 > A1/2 \times d3/f1 \tag{1}$$

When applying the parameters shown in the table 1 that are, A1=10 μm, d3=58 mm, and f1=0.1 mm to calculate the right hand side of the expression (1), the solution becomes 2.9 mm. This shows that the inflection point of the condenser lens 13 (h=5.1) is on the outer side of the light beam, which is emitted from the center of the emission area and enters into the condenser lens 13.

The operational result of the laser device according to the example 1 will be described in detail comparing with a following comparative example 1 and comparative example 2.

Figure 7:
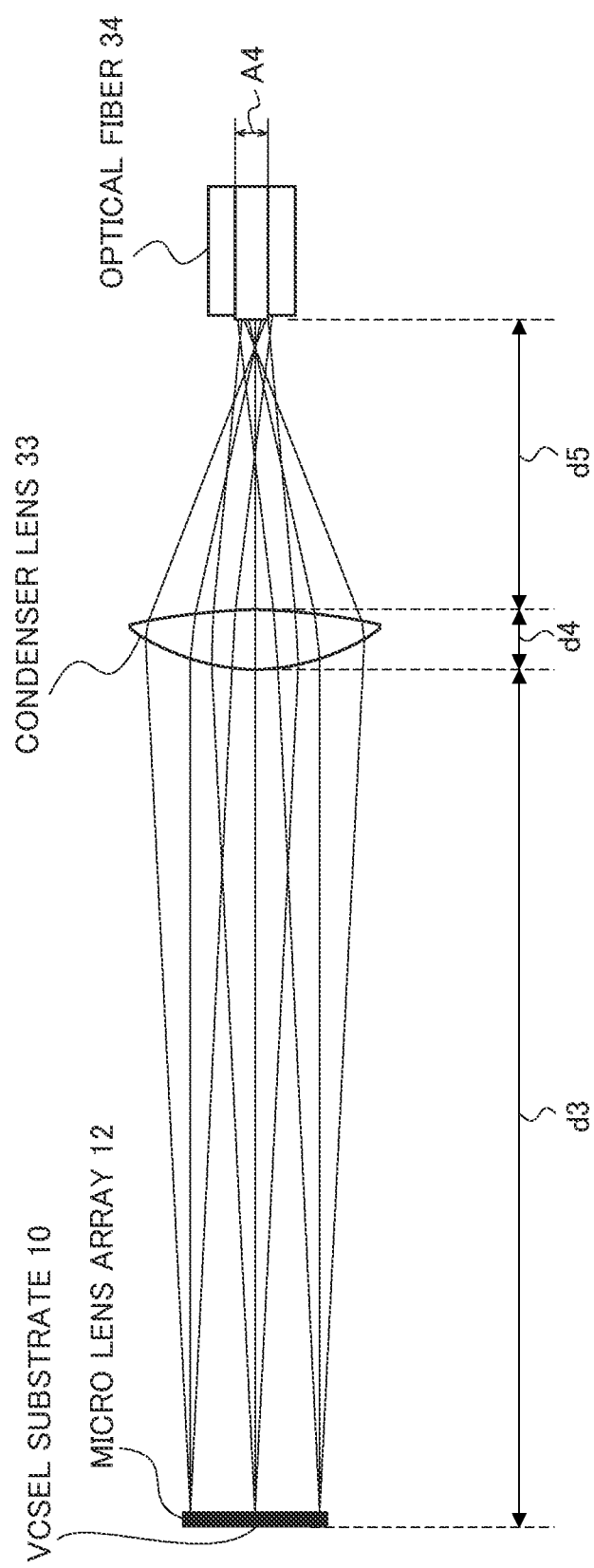
FIG. 7 is a plan diagram showing an arrangement of a laser device according to a comparative example 1 for making a comparison with the embodiments of the present invention, the laser device includes a micro lens array, a condenser lens and an optical fiber.

In order to show the result, the comparative example 1 and the comparative example 2 will be described. The table 3, table 4, and FIG. 7 are shown as the comparative example 1. A condenser lens 33 according to the comparative example 1 is a light condensing optical system including a bi-spherical lens. To clearly distinguish the result of the example 1, the A1, A2, A3, and d2 in the comparative example 1 are the same as the above-described data in the example 1. The maximum incidence angle in the comparative example 1 is also the same as that in the example 1 so as to use the same numerical aperture NA of the optical fiber. Note that the same configurations as in the embodiment 1 are given with the same reference characters, and their explanation will be omitted. When using a spherical lens for the condenser lens 33, the lens incidence angle of the diverging light flux from the VCSEL substrate 10 is relatively determined. Then, only the focal length of the lens is adjusted as the design parameter. Consequently, the focal length becomes longer in the comparative example 1 than that in the example 1. In addition, since the light beam entering into the peripheral portion of the lens is strongly influenced by the spherical aberration, the light condensing diameter on an optical fiber 34 increases. As a result, the light condensing diameter A4 becomes 2.97 mm, which is about twice as longer as that in the example 1.

TABLE 3

BI-SPHERICAL LENS
OPTICAL SYSTEM DATA OF COMPARATIVE EXAMPLE 1

| | |
|---|---|
| A1 (μm) | 10 |
| A2 (μm) | 48 |
| A3 (mm) | 8.9 |
| A4 (mm) | 2.97 |
| d1 (mm) | 0.0964 |
| d2 (mm) | 1.036 |
| d3 (mm) | 58 |
| d4 (mm) | 3.46 |
| d5 (mm) | 21.0 |
| MAXIMUM INCIDENCE ANGLE (deg) | 22.9 |
| CURVATURE OF CONDENSER LENS | 1.51633 |
| FOCAL LENGTH OF CONDENSER LENS (mm) | 21.66 |

TABLE 4

LENS OF COMPARATIVE EXAMPLE 1

| | INCIDENCE SURFACE | EMISSION SURFACE |
|---|---|---|
| R | 14.968 | −38.906 |

When using the spherical lens as the condenser lens 33 of the comparative example 1, the light condensing diameter A4 increases mainly due to the influence of the spherical aberration. Therefore, the aberration-corrected aspheric lens is often used in the general optical design.

Figure 8:
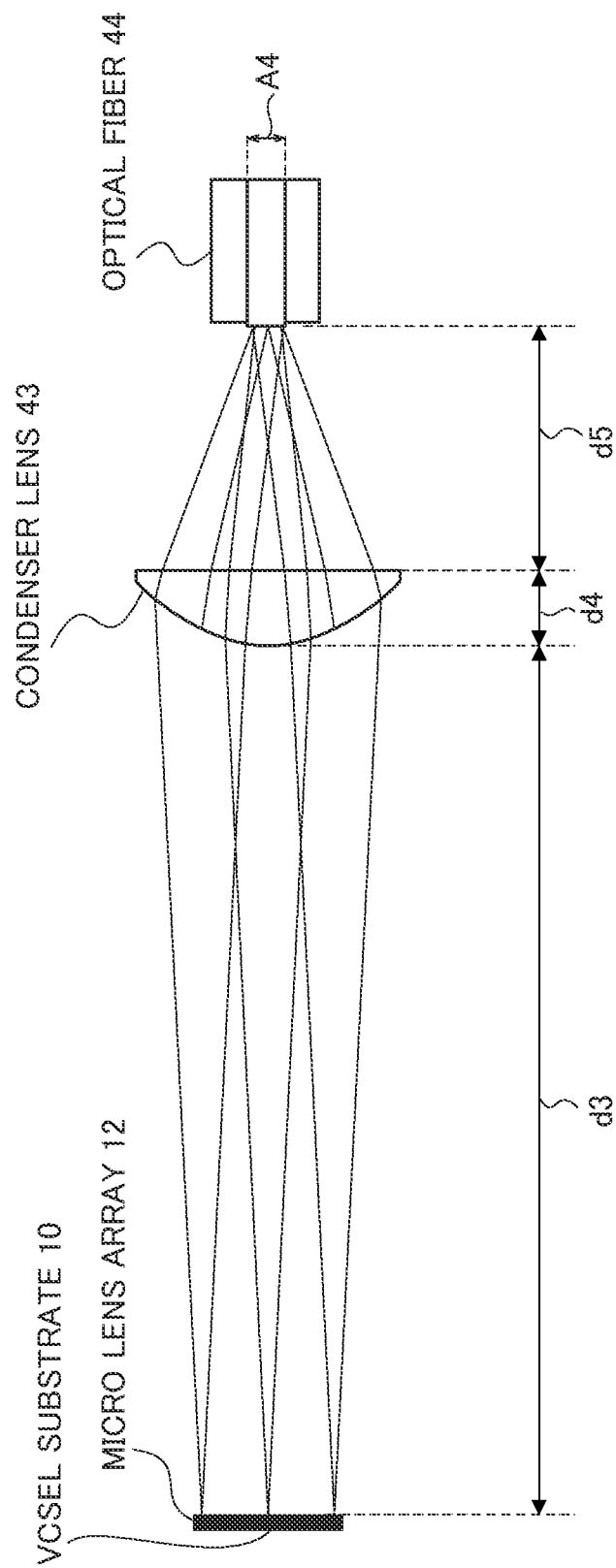
FIG. 8 is a plan diagram showing an arrangement of a laser array according to a comparative example 2.
Figure 9:
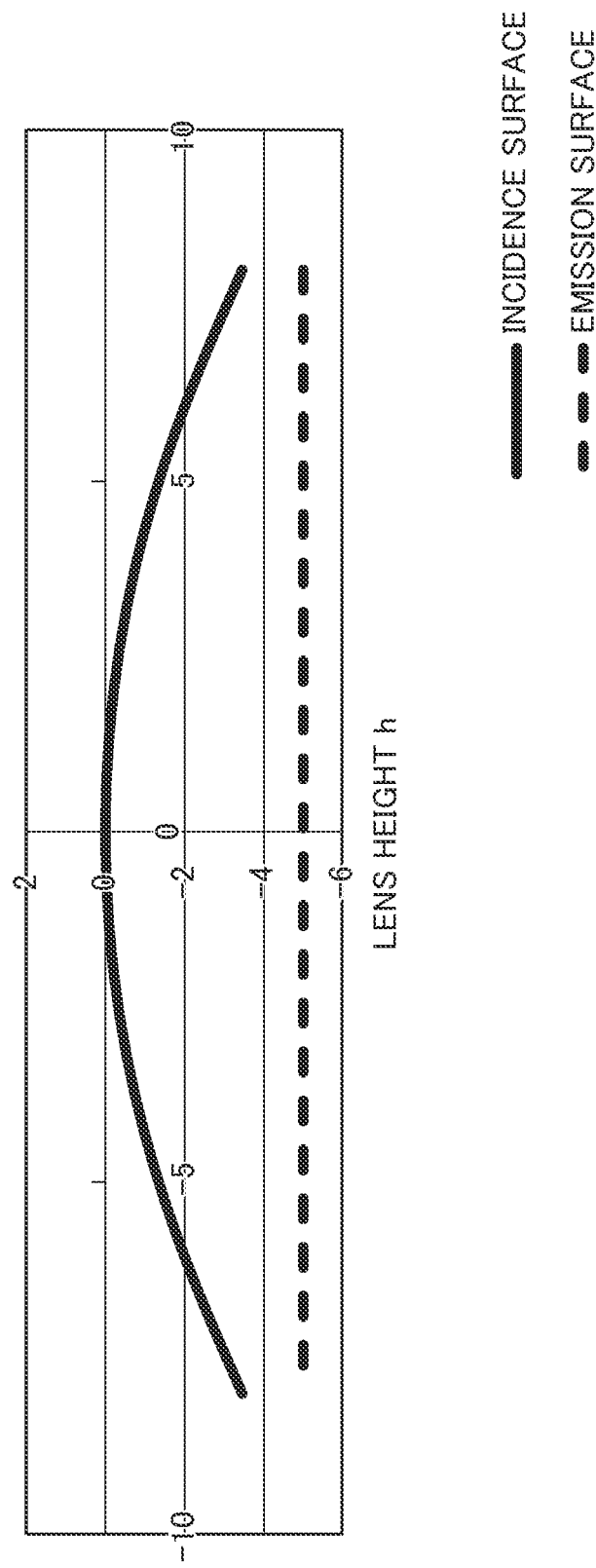
FIG. 9 is a diagram showing a surface shape of a condenser lens included in the laser device according to the comparative example 2 by plotting a lens height on a horizontal axis and plotting a depth of lens groove on a vertical axis where a lens center of the incidence surface is an origin.
Figure 10:
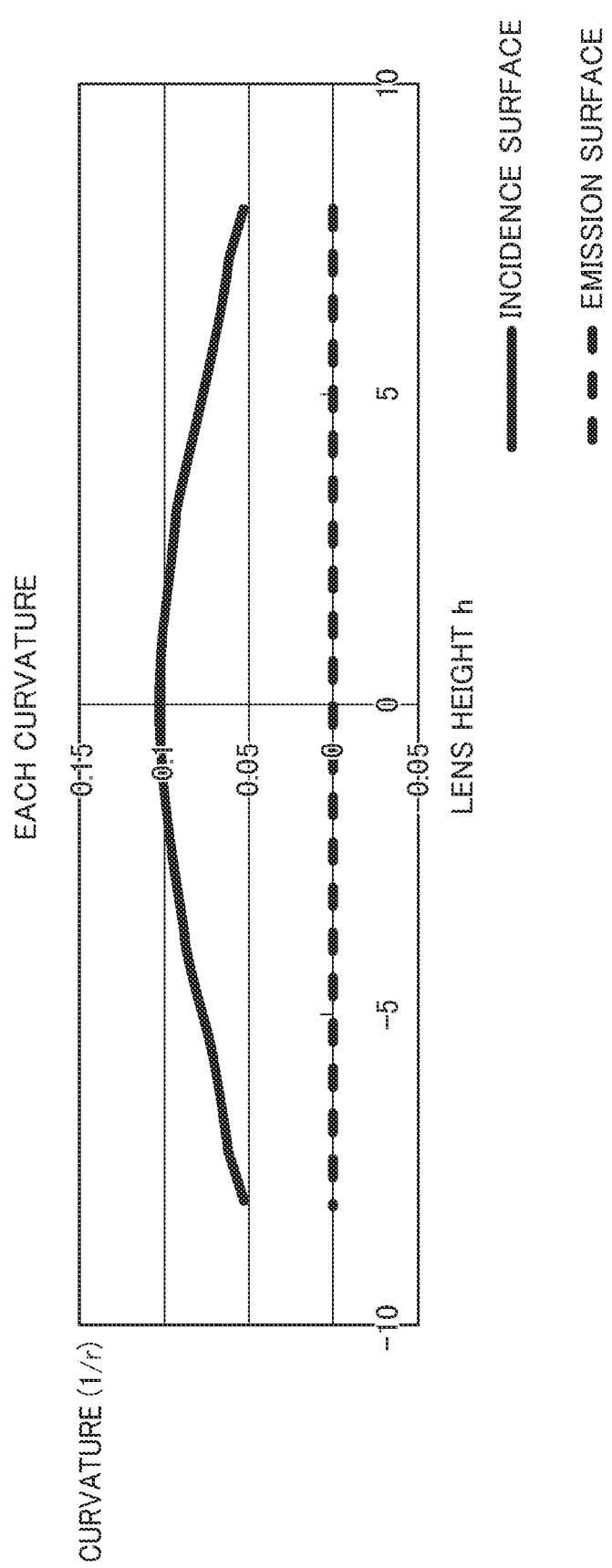
FIG. 10 is a diagram plotting a curvature on each lens height of a condenser lens included in the laser device according to the comparative example 2.

Next, as the comparative example 2, a laser device including an aberration corrected hemi-aspherical lens as a condenser lens 43 is shown in the table 5, table 6, FIG. 8, FIG. 9, and FIG. 10. Similar to the comparative example 1, the A1, A2, A3, and d2 in the comparative example 2 is in the same condition as the above described data in the example 1 in order to clearly distinguish the result of the example 1. The maximum incidence angle in the comparative example 2 is the same as that of the example 1 so as to use the same numerical aperture NA of the optical fiber in an optical fiber 44. Note that the same configurations as in the embodiment 1 are given with the same reference characters, and their explanation will be omitted.

TABLE 5

OPTICAL SYSTEM DATA OF COMPARATIVE EXAMPLE 2

| | |
|---|---|
| A1 (μm) | 10 |
| A2 (μm) | 48 |
| A3 (mm) | 8.9 |
| A4 (mm) | 2.6 |
| d1 (mm) | 0.0964 |
| d2 (mm) | 1.036 |
| d3 (mm) | 58 |
| d4 (mm) | 5 |
| d5 (mm) | 16.5 |
| MAXIMUM INCIDENCE ANGLE (deg) | 22.9 |
| CURVATURE OF CONDENSER LENS | 1.51633 |
| FOCAL LENGTH OF CONDENSER LENS (mm) | 18.85 |

TABLE 6

HEMI-SPHERICAL LENS

INCIDENCE SURFACE

| | |
|---|---|
| R | 9.6144 |
| K | 0 |
| B4 | −1.53E−04 |
| B6 | 2.91E−06 |
| B8 | −1.28E−07 |
| B10 | 1.83E−09 |
| B12 | −1.14E−11 |

Since the aberration-corrected aspheric lens can correct the spherical aberration on one side of the aspheric surface, the aberration-corrected aspheric lens forms a plane-convex lens. For spherical aberration correction, it is appropriate to decrease the positive curvature (refractive power) from the lens center toward the peripheral side.

By correcting the spherical aberration, the diverging or scattering of the light beam is suppressed, and the light condensing diameter can be decreased. In the aberration-corrected lens, the lens surface shape is unambiguously determined for correcting the spherical aberration. Since the incidence angle of the light beam entering into the most outside portion is defined by the numerical aperture NA of the optical fiber 44, the focal length is also unambiguously determined. When comparing the comparative example 1 with the comparative example 2, the focal length in the comparative example 2 is shorter than that of the spherical condenser lens 33 in the comparative example 1 by using the aberration-corrected hemi-aspherical lens. However, the focal length and the light condensing diameter cannot be decreased further according to the comparative example 2, compared with the example 1 of the present invention which includes the condenser lens 13 having the curvature and the inflection point of the surface shape as described above.

Example 2

Figure 11:
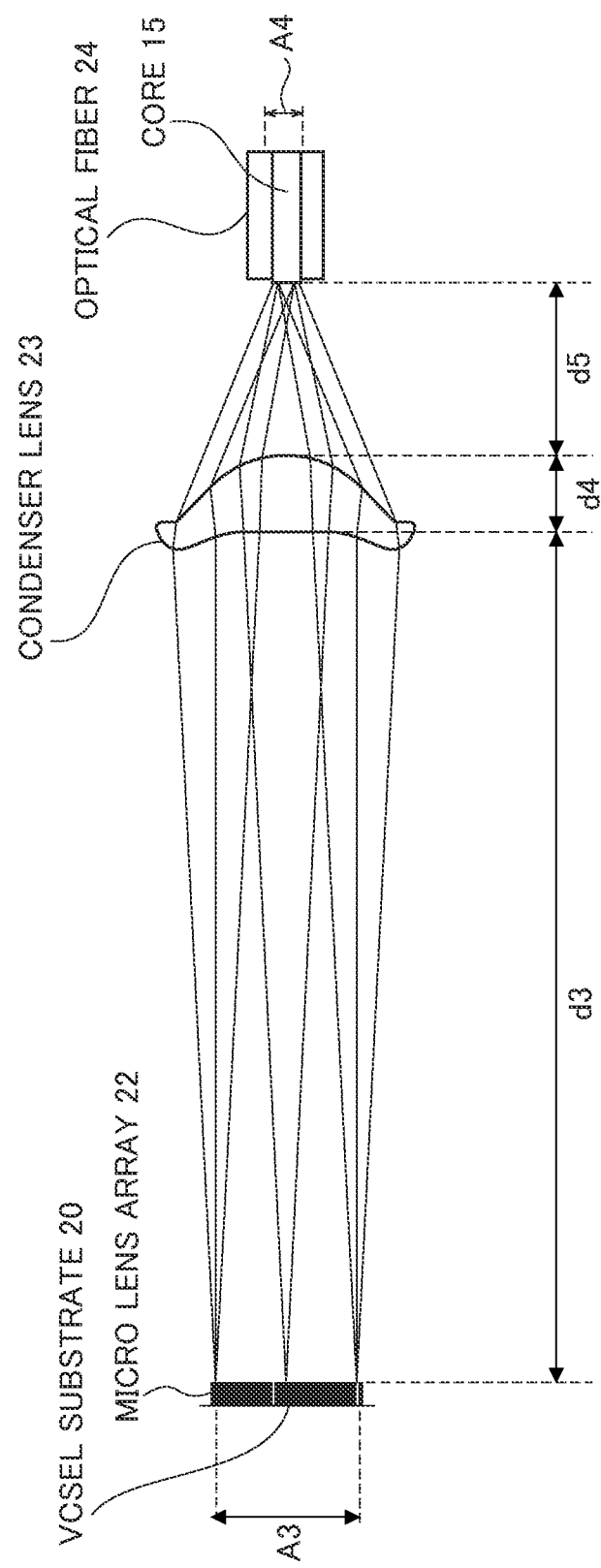
FIG. 11 is a plan diagram showing an arrangement of a laser device according to an embodiment 2 and an example 2.
Figure 12:
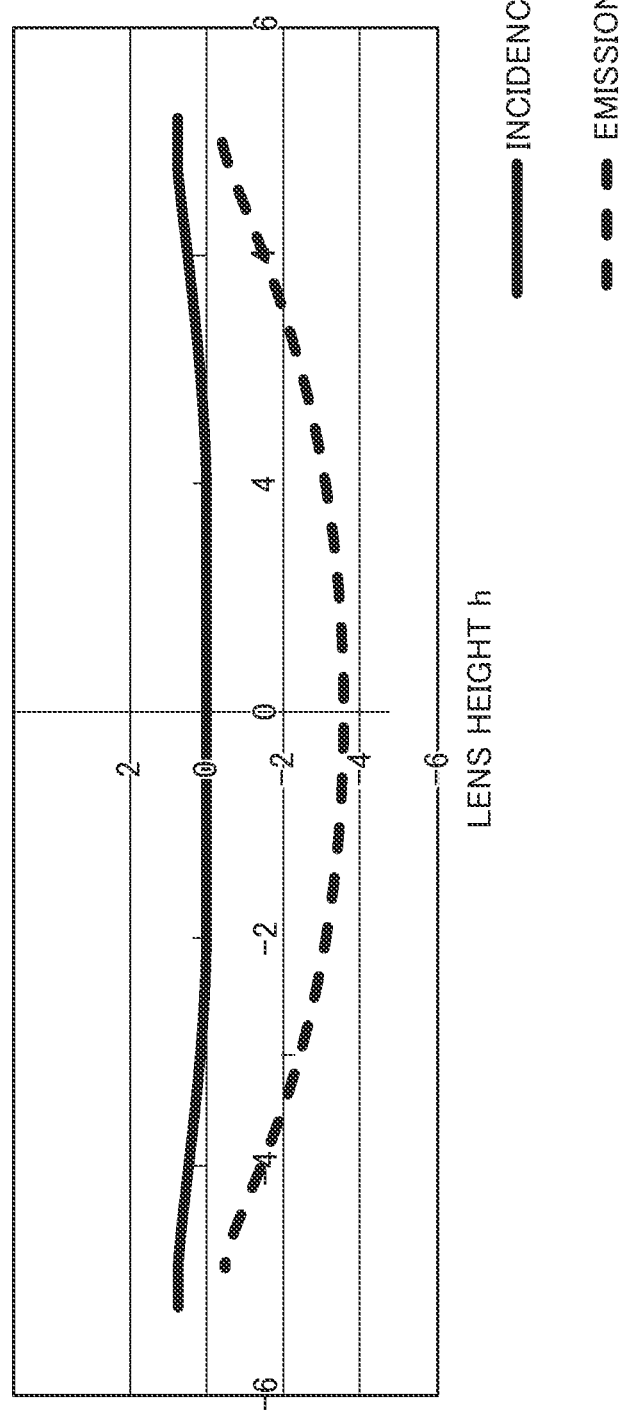
FIG. 12 is a diagram showing a surface shape of a condenser lens included in the laser device according to the embodiment 2 and the example 2 of the present invention by plotting a lens height on a horizontal axis and a depth of lens groove on a vertical axis, where a lens center of an incidence surface is an origin.
Figure 13:
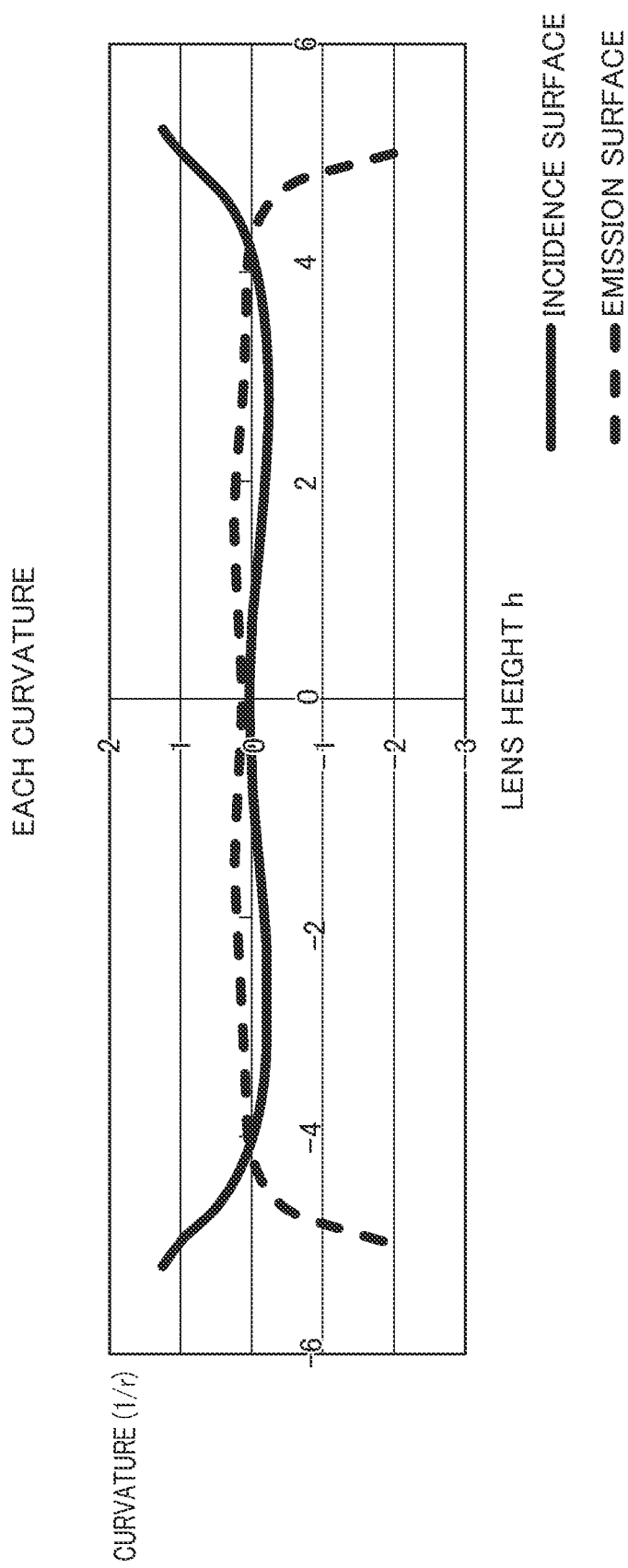
FIG. 13 is a plotted diagram showing a curvature on each lens height of the condenser lens included in the laser device according to the example 2.

Next, a laser device according to an example 2 will be explained. The laser device of example 2 is arranged on a VCSEL substrate 20. The table 7, table 8, FIG. 11, FIG. 12, and FIG. 13 show various data and the shape of the condenser lens of the laser device where the diameter A3 of the VCSEL emission area is 6.6 mm. A focal length of a micro lens array 22 is 0.1 mm, which is the same as that in the example 1. In the example 1, the condenser lens 13 has the inflection point on the emission surface thereof. On the other hand, a condenser lens 23 in the example 2 having the inflection point on the incidence surface also manages to decrease the light condensing diameter.

The following table 7 shows various data of the optical system according to the example 2. The following table 8 shows the parameter of the aspheric surface which defines the surface shape of the condenser lens according to the example 2.

TABLE 7

FIBER CORE DIAMETER AND MAXIMUM INCIDENCE ANGLE OPTICAL SYSTEM DATA OF EXAMPLE 2

| | |
|---|---|
| A1 (μm) | 10 |
| A2 (μm) | 48 |
| A3 (mm) | 6.6 |
| A4 (mm) | 1.05 |
| d1 (mm) | 0.911 |
| d2 (mm) | 1.036 |

TABLE 7-continued

FIBER CORE DIAMETER AND MAXIMUM INCIDENCE ANGLE OPTICAL SYSTEM DATA OF EXAMPLE 2

| | |
|---|---|
| d3 (mm) | 39.7 |
| d4 (mm) | 3.593 |
| d5 (mm) | 8.182 |
| MAXIMUM INCIDENCE ANGLE (deg) | 22.9 |
| CURVATURE OF CONDENSER LENS | 1.51633 |
| FOCAL LENGTH OF CONDENSER LENS (mm) | 8.86 |
| FOCAL LENGTH OF MICRO LENS ARRAY F1 (mm) | 0.1 |

TABLE 8

CONDENSER LENS SHAPE OF EXAMPLE 2

| | INCIDENCE SURFACE | EMISSION SURFACE |
|---|---|---|
| R | 18.038 | −5.623 |
| K | 0 | 0 |
| B4 | −6.40E−03 | −5.14E−03 |
| B6 | 2.38E−04 | 3.89E−04 |
| B8 | −6.79E−06 | −9.46E−06 |
| B10 | 1.99E−07 | −9.66E−08 |
| B12 | −2.02E−09 | 7.28E−09 |

The incidence surface of the condenser lens 23 of the example 2 has the curvature of the positive refractive power on the lens center. The positive power decreases toward the peripheral side. The curvature changes from the positive refractive power to the negative refractive power at the height of 0.89. The negative curvature has the minimum value (extreme value) at the height of 2.88, and gradually changes to be positive toward the most peripheral side. The inflection point of the surface shape is at the height of 4.99 on the incidence surface.

The condenser lens 23 has such an aspheric surface so that the smallest light condensing diameter A4 of the condenser lens 23 on an optical fiber 24 becomes as small as 1.05 mm. It is appropriate that the condenser lens 23 satisfies the following condition (1).

$$h1 > A1/2 \times d3/f1 \quad (1)$$

When using the parameters shown in the table 7 that are, A1=10 μm, d3=39.7 mm, and f1=0.1 mm, the right side of the condition (1) equals to 1.985 mm. The condenser lens 23 according to the example 2 has the inflection point of the surface shape only on the incidence surface. This shows that the inflection point of the condenser lens 23 (h=4.99) is on the outer side of the light beam, which is emitted from the center of the emission area and enters into the condenser lens 23.

According to the embodiments and examples of the present invention, the curvature radius at each lens height can be arranged appropriately according to the plurality of light fluxes emitted from the surface-emitting laser. Thereby, the light condensing diameter can be reduced to provide the laser device capable of condensing the light at high efficiency with the minimum configuration.

Although the present invention has been described in terms of exemplary embodiments, it is not limited thereto. It should be appreciated that variations or modifications may be made in the embodiments described by persons skilled in the art without departing from the scope of the present invention as defined by the following claims.

What is claimed is:

1. A laser device comprising:
   a surface-emitting laser including a plurality of emission points;
   a lens array including a plurality of lenses arranged so as to correspond to a position of the surface-emitting laser; and
   a light condensing optical system that condenses a plurality of light fluxes emitted through the lens array and enters the condensed lights to an input end of an optical fiber,
   wherein the light condensing optical system includes an aspheric lens having positive refractive power,
   wherein both of an incidence surface and an emission surface of the aspheric lens have aspheric shapes,
   wherein each of the incidence surface and the emission surface of the aspheric lens has a rotational symmetry shape, and the rotational symmetry shape is configured such that a curvature of the aspheric lens has an extreme value at a height other than zero,
   wherein the aspheric lens is a positive biconvex lens in which a curvature of the emission surface is larger than a curvature of the incidence surface at a lens center of the aspheric lens,
   wherein the incidence surface of the aspheric lens has a positive refractive power at every lens height, and
   wherein the emission surface of the aspheric lens has a positive refractive power at the lens center and the positive refractive power of the emission surface decreases towards peripheral sides of the aspheric lens such that the curvature of the emission surface changes from positive refractive power to a maximum negative refractive power at a predetermined lens height, and the refractive power increases from the predetermined lens height to the peripheral side of the aspheric lens such that the refractive power at the peripheral side is positive.

2. The laser device according to claim 1, wherein at least one of the incident surface and the emission surface of the aspheric lens has an inflection point of a surface shape at the height other than zero.

3. The laser device according to claim 1, further comprising a light condensing lens that satisfies a following condition (1), $$h1 > A1/2 \times d3/f1 \quad (1)$$

where a focal length of the lens array is f1,
an emission area diameter per 1 channel of the surface-emitting laser is A1,
a distance from the lens array to the light condensing optical system is d3, and
a lens height of the surface of the light condensing optical system at an inflection point is h1, in one of the incidence surface and the emission surface of the light condensing optical system.

4. The laser device according to claim 1, further comprising a light condensing lens that satisfies a following condition (1), $$h1 > A1/2 \times d3/f1 \quad (1)$$

where a focal length of the lens array is f1,
an emission area diameter per 1 channel of the surface-emitting laser is A1,
a distance from the lens array to the light condensing optical system is d3, and
a lens height of the surface of the light condensing optical system at an inflection point is h1, in one of the incidence surface and the emission surface of the light condensing optical system, and
wherein at least one of the incident surface and the emission surface of the aspheric lens has an inflection point of a surface shape at the height other than zero.

* * * * *